(12) United States Patent
Lim et al.

(10) Patent No.: US 8,974,606 B2
(45) Date of Patent: Mar. 10, 2015

(54) EX-SITU CLEANING ASSEMBLY

(75) Inventors: Gregory Lim, Fremont, CA (US);
Aaron Francis, San Jose, CA (US);
Kenneth Williams, Livermore, CA
(US); Sandeep Mariserla, La Jolla, CA
(US)

(73) Assignee: Intermolecular, Inc., San Jose, CA (US)

( * ) Notice: Subject to any disclaimer, the term of this patent is extended or adjusted under 35 U.S.C. 154(b) by 975 days.

(21) Appl. No.: 13/103,965

(22) Filed: May 9, 2011

(65) Prior Publication Data
US 2012/0285493 A1 Nov. 15, 2012

(51) Int. Cl.
| | |
|---|---|
| B08B 3/00 | (2006.01) |
| H01L 21/67 | (2006.01) |
| B08B 3/02 | (2006.01) |
| H01L 21/677 | (2006.01) |
| H01L 21/683 | (2006.01) |
| B05B 1/20 | (2006.01) |

(52) U.S. Cl.
CPC ............ *H01L 21/67028* (2013.01); *B08B 3/02* (2013.01); *H01L 21/67051* (2013.01); *H01L 21/67057* (2013.01); *H01L 21/67751* (2013.01); *H01L 21/6838* (2013.01); *B05B 1/20* (2013.01)
USPC ...................................................... 134/115 R

(58) Field of Classification Search
None
See application file for complete search history.

(56) References Cited

U.S. PATENT DOCUMENTS

| | | | |
|---|---|---|---|
| 3,035,888 A | 5/1962 | Massey | |
| 3,188,181 A | 6/1965 | Peterson et al. | |
| 3,265,080 A | 8/1966 | De Young et al. | |
| 3,482,587 A | 12/1969 | Alexander | |
| 3,878,727 A | 4/1975 | Burns | |
| 4,216,879 A | 8/1980 | McMillin | |
| 4,225,248 A | 9/1980 | Para | |
| 4,299,245 A | 11/1981 | Clapper | |
| 4,375,767 A | 3/1983 | Magori | |
| 4,477,287 A | 10/1984 | Kush et al. | |
| 4,622,988 A | 11/1986 | Takimoto et al. | |
| 5,251,148 A | 10/1993 | Haines et al. | |

(Continued)

FOREIGN PATENT DOCUMENTS

WO 2007063112 A1 6/2007

OTHER PUBLICATIONS

Modular Platform for High-Throughput Formulation of Highly Viscous Fluids and Powders; Flamac VZW; http://www.flamac.be/wp-content/uploads/2010/01/vf_hte_en1.pdf, 2 pages.

(Continued)

*Primary Examiner* — Jason Ko

(57) ABSTRACT

A cleaning assembly is provided. The cleaning assembly includes a plate having a front surface and a back surface and a manifold affixed to an edge of the plate. The manifold has a plurality of outlets extending therefrom. The plate further includes a plurality of cups extending through the plate. The plurality of cups have an upper body with an outlet extending from the back surface and the plurality of cups have a sealing portion coupled to the upper body and extending from the front surface of the plate. Each outlet of the upper body is coupled to one of the corresponding plurality of outlets of the manifold. The plate also includes a plurality of alignment pins extending from the front surface of the plate. The plurality of alignment pins are configured to support an edge of a substrate, wherein one of the plurality of alignment pins is slidably mounted to the plate. A plurality of guide pins extends the same distance from the back surface.

14 Claims, 9 Drawing Sheets

(56) References Cited

U.S. PATENT DOCUMENTS

| | | |
|---|---|---|
| 5,258,921 A | 11/1993 | Ellis |
| 5,383,574 A | 1/1995 | Raphael |
| 5,522,660 A | 6/1996 | O'Dougherty et al. |
| 5,568,882 A | 10/1996 | Takacs |
| 5,590,695 A | 1/1997 | Siegele et al. |
| 5,603,351 A | 2/1997 | Cherukuri et al. |
| 5,636,762 A | 6/1997 | Juhola et al. |
| 6,008,010 A | 12/1999 | Greenberger et al. |
| 6,142,017 A | 11/2000 | Glassey |
| 6,168,048 B1 | 1/2001 | Xu et al. |
| 6,367,458 B1 | 4/2002 | Furusho et al. |
| 6,368,562 B1 | 4/2002 | Yao |
| 6,616,772 B2 | 9/2003 | de Larios et al. |
| 6,689,215 B2 | 2/2004 | Nguyen |
| 6,837,967 B1 | 1/2005 | Berman et al. |
| 7,487,806 B2 | 2/2009 | Letessier et al. |
| 2002/0048536 A1 | 4/2002 | Bergh et al. |
| 2004/0140203 A1 | 7/2004 | Burkhart et al. |
| 2004/0245214 A1 | 12/2004 | Katakabe et al. |
| 2007/0225186 A1 | 9/2007 | Fisher |
| 2007/0285631 A1 | 12/2007 | Stavenga et al. |
| 2008/0225248 A1 | 9/2008 | Poon et al. |
| 2009/0308484 A1 | 12/2009 | Nakagawa et al. |
| 2010/0175715 A1 | 7/2010 | Kumar et al. |
| 2010/0186775 A1 | 7/2010 | Madsen |

OTHER PUBLICATIONS

High-Throughput Formulation, Application and Screening of High Viscous Solutions/Dispersions/Pastes (SDP); Flamac VZW; http://www.flamac.be/wp-content/uploads/2010/01/sdp_introduction2.pdf, 1 page.

USPTO; Final Office Action for U.S. Appl. No. 12/108,456 mailed on Mar. 8, 2012, 14 pages.

EX-SITU CLEANING ASSEMBLY

RELATED APPLICATIONS

This application is related to U.S. application Ser. No. 13/086,327 filed Apr. 13, 2011, entitled, "In-Situ Cleaning Assembly."

BACKGROUND

Combinatorial processing of substrates performs processing on several regions of a substrate differently. The areas surrounding these regions are not processed as the regions are isolated during the processing. More than half of the substrate's surface may be unprocessed. It may be desirable to take the substrate processed in a combinatorial processing chamber and reinsert it into a conventional processing chamber to complete the formation of a structure or device for subsequent testing, screening or characterization. The unprocessed areas may preclude the substrate from being reinserted into a conventional substrate processing line, as the mask material, or any other contaminant, on the unprocessed areas remains. The mask material or other contaminants could contaminate a conventional processing chamber unless the material is removed from the unprocessed areas of the substrate. The additional processing afforded by reinserting the substrate into a conventional processing chamber may be required before a process from the combinatorial processing chamber and the resulting substrate can be characterized. Accordingly, if the substrate could be reinserted into the conventional processing line, the substrate could undergo further processing in order to evaluate the combinatorial processing.

It is within this context that the current embodiments arise.

SUMMARY

Embodiments of the present invention provide a cleaning assembly that enables cleaning of the unprocessed regions of the substrate in order to enable insertion of the substrate into a semiconductor processing line in order to be able to characterize the substrate and the combinatorial processing.

In one aspect of the invention, a cleaning assembly is provided. The cleaning assembly includes a plate having a front surface and a back surface and a manifold affixed to an edge of the plate. The manifold has a plurality of outlets extending therefrom. The plate further includes a plurality of cups extending through the plate. The plurality of cups have an upper body with an outlet extending from the back surface and the plurality of cups have a sealing portion coupled to the upper body and extending from the front surface of the plate. Each outlet of the upper body is coupled to one of the corresponding plurality of outlets of the manifold. The plate also includes a plurality of alignment pins extending from the front surface of the plate. The plurality of alignment pins are configured to support an edge of a substrate over the sealing portion of the plurality of cups, wherein one of the plurality of alignment pins is slidably mounted to the plate. A plurality of guide pins extends the same distance from the back surface. In one embodiment, the plurality of cups each have a channel extending from the outlet extending from the outlet of the upper body to the sealing portion, wherein the upper body of each of the plurality of cups are independently flexibly supported by the plate. The cleaning assembly may support the substrate in a horizontal or vertical orientation during the cleaning.

In another aspect of the invention, a substrate cleaning system is provided. The cleaning system includes a tank configured to hold a cleaning solution and a masking frame configured to support a substrate. The masking frame supports the substrate through a plurality of cups floatably mounted through the masking frame and a plurality of alignment pins extending from a surface of the masking frame. The plurality of alignment pins support an edge of the substrate and the plurality of cups support a surface of the substrate. Each of the plurality of cups isolates a region of the substrate as the substrate is placed into the cleaning solution. A manifold is affixed to the masking frame, the manifold is in fluid communication with each of the plurality of cups and a vacuum source.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

Figure 11A:
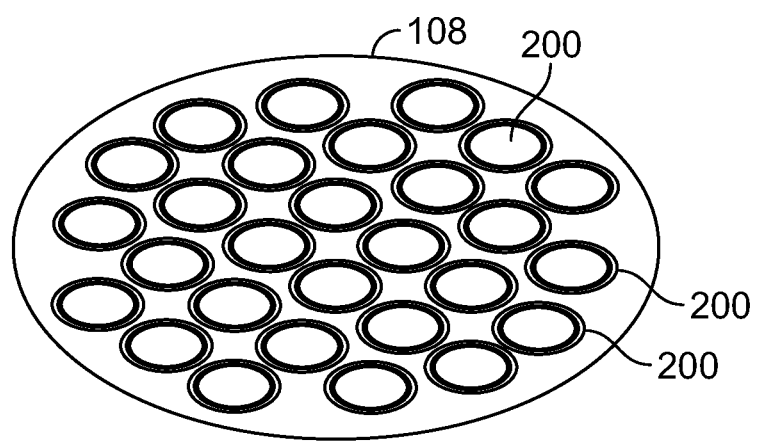
FIG. 11A is a simplified schematic diagram of a substrate that may be supported and processed with the cleaning assembly described herein in accordance with one embodiment of the invention.
Figure 11B:
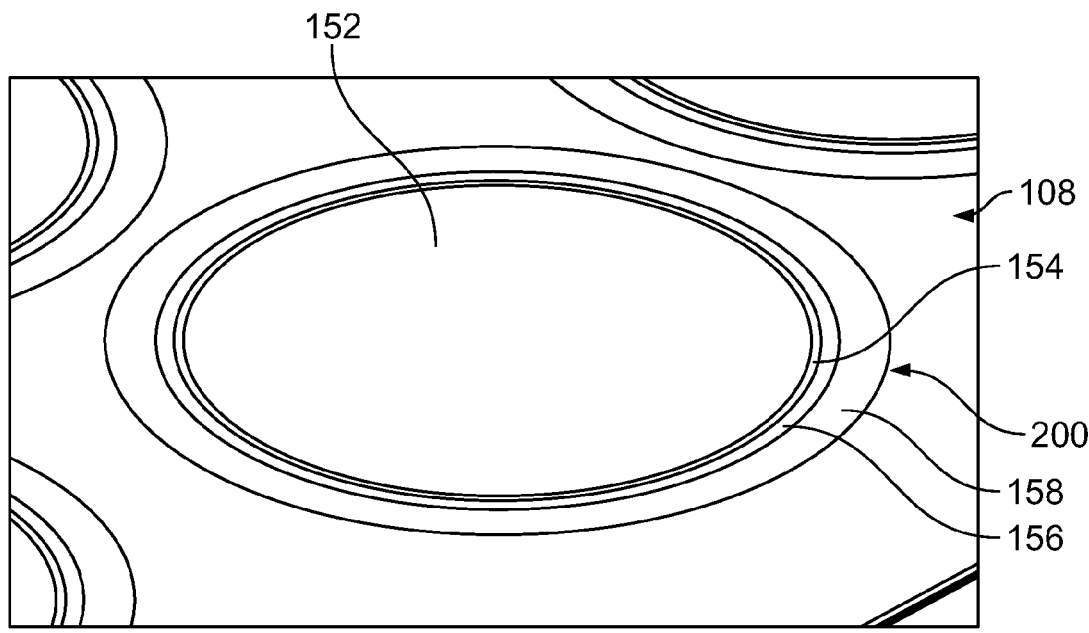
FIG. 11B is a simplified schematic diagram illustrating details on the isolation of the regions for the cleaning of the area outside of the regions in accordance with one embodiment of the invention.
Figure 11C:
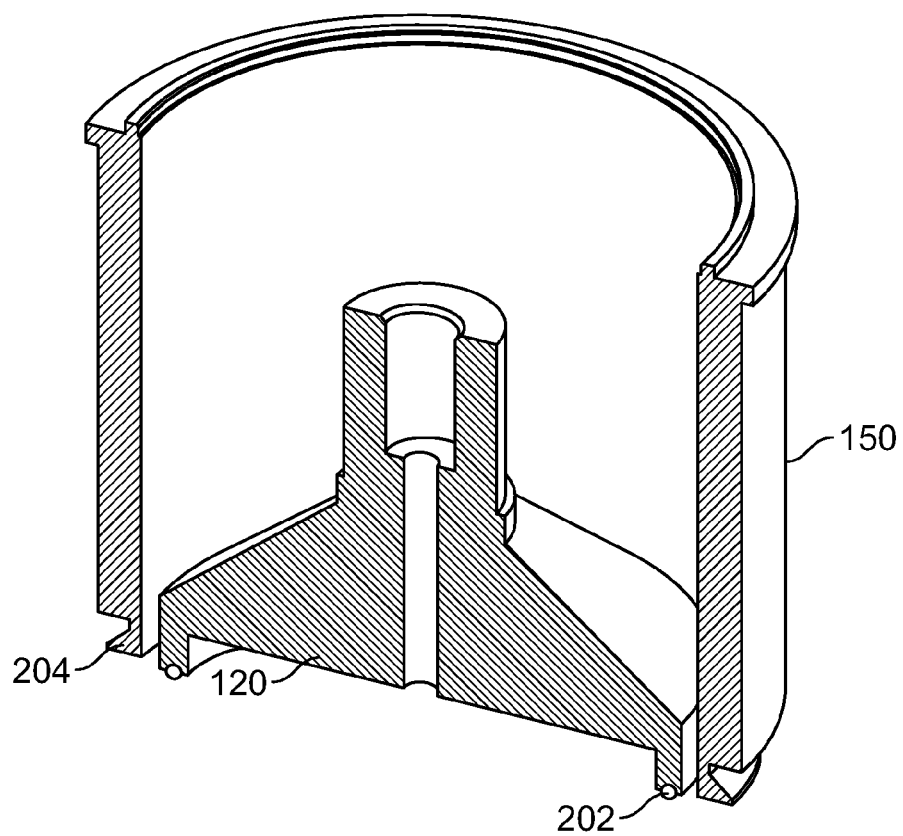
FIG. 11C is a simplified schematic diagram of a cross sectional view of the site isolated reactor sleeve and the cup that results in the configuration of the region of FIG. 11B in accordance with one embodiment of the invention.

11D is a simplified schematic diagram illustrating a cross sectional view of the site isolated reactor sleeve and cup of FIG. 11C disposed over a corresponding region of the substrate of FIG. 11B in accordance with one embodiment of the invention.

Figure 12:
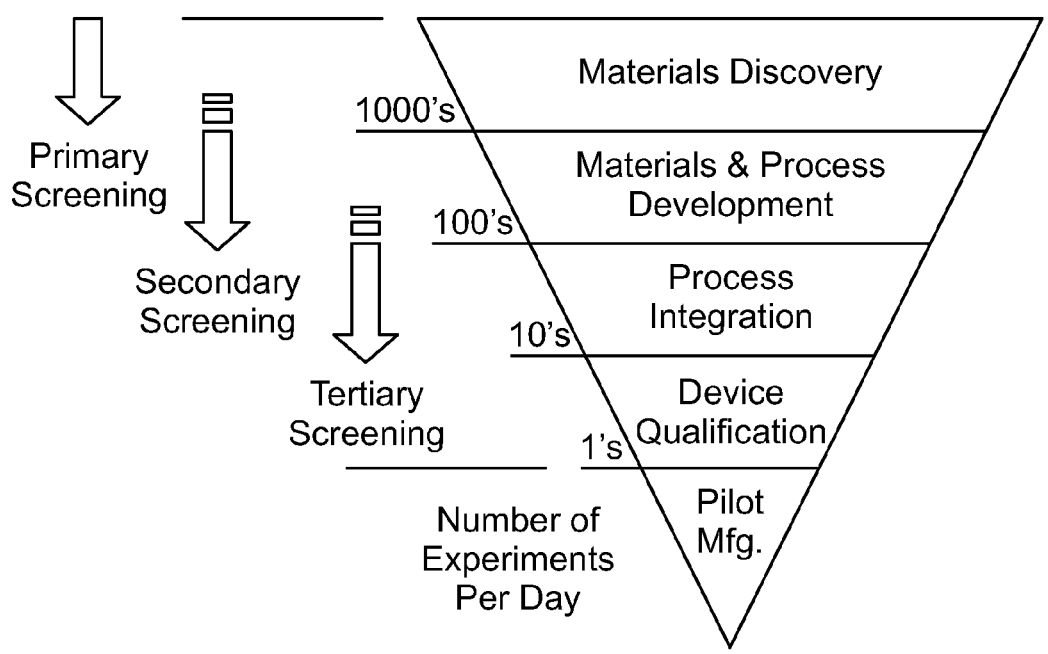

FIG. 12 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention.

DETAILED DESCRIPTION

The embodiments described herein provide a method and apparatus for cleaning unprocessed regions of a combinatorially processed substrate (i.e. a substrate that has different isolated regions of the substrate processed differently). It will be obvious, however, to one skilled in the art, that the present invention may be practiced without some or all of these specific details. In other instances, well known process operations have not been described in detail in order not to unnecessarily obscure the present invention.

The embodiments described herein provide for an ex-situ cleaning assembly that supports a substrate and isolates combinatorially processed regions while supporting the substrate. Thus, the cleaning assembly may be submerged into a cleaning solution within a cleaning tank. The cleaning solution has access to all of the unprocessed regions of the substrate, while the cups providing the support of the substrate isolates the regions of the substrate that have been combinatorially processed. As a result, the unprocessed region, which may have a mask material or other contaminants disposed thereon, is cleaned so that the entire substrate may be introduced into a semiconductor tool, such as a deposition tool, etch tool, etc.

The embodiments described herein enable the application of combinatorial techniques to process sequence integration in order to arrive at a globally optimal sequence of the manufacturing operations by considering interaction effects between the unit manufacturing operations, the process conditions used to effect such unit manufacturing operations, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further below analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate, which are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity.

Figure 1:
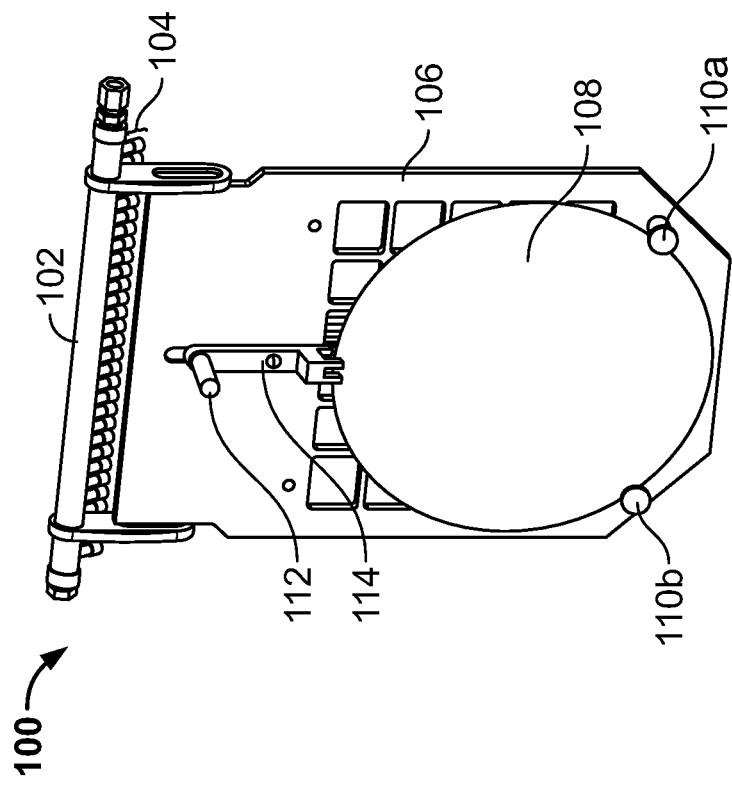
FIG. 1 is a simplified schematic diagram illustrating a front perspective view of a cleaning assembly in accordance with one embodiment of the invention.

FIG. 1 is a simplified schematic diagram illustrating a front perspective view of a cleaning assembly in accordance with one embodiment of the invention. Cleaning assembly 100 includes plate 106, which may be referred to as a masking frame, and manifold 102. Extending from manifold 102 are a plurality of outlets 104. Substrate 108 is supported by alignment pins 110a and 110b, as well as an alignment pin 124 underneath slide body 114 that is visible in FIG. 3. Substrate 108 may be a combinatorially processed substrate as illustrated with reference to FIGS. 11A and 11B in one embodiment. Handle 112 extends from a surface of slide body 114 and is used to raise or lower the slide body as well as lock or release the slide position.

Figure 2:
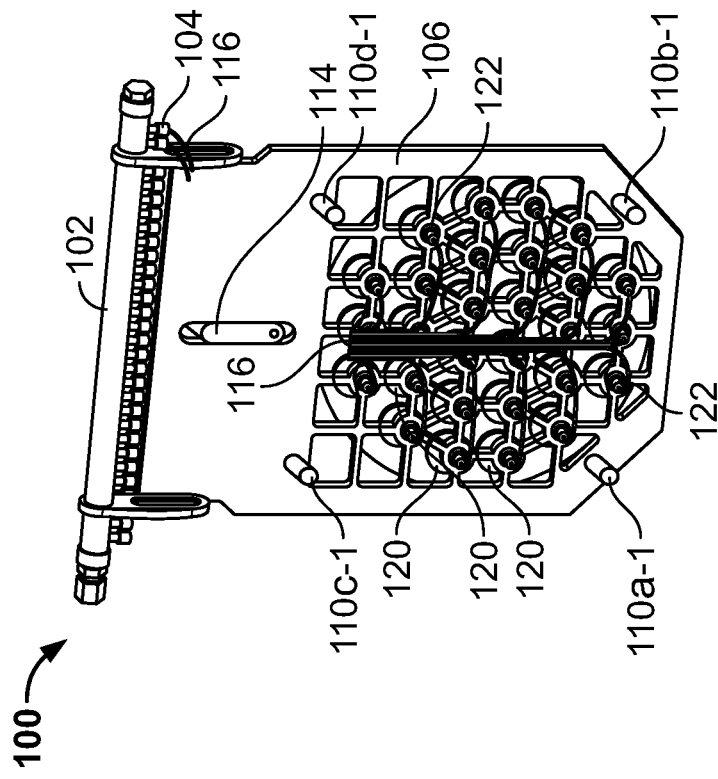
FIG. 2 is a simplified schematic diagram illustrating a back perspective view of a cleaning assembly in accordance with one embodiment of the invention.
Figure 3:
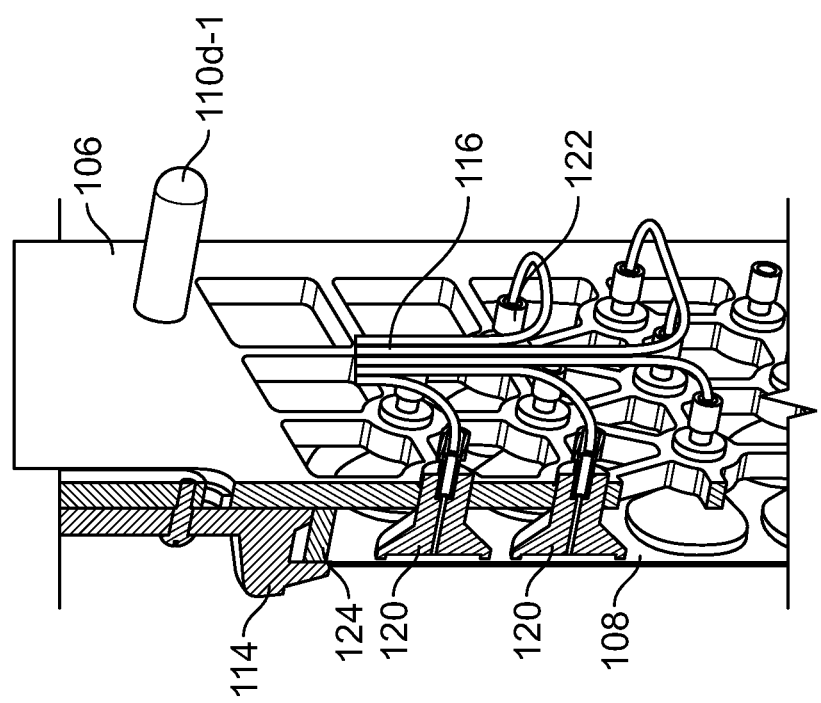
FIG. 3 is a simplified schematic diagram illustrating a cross-sectional view of the cleaning assembly in accordance with one embodiment of the invention.

FIG. 2 is a simplified schematic diagram illustrating a back perspective view of a cleaning assembly in accordance with one embodiment of the invention. Cleaning assembly 100 includes plate 106. Manifold 102 is affixed to the side edge surfaces of plate 106. Extending from manifold 102 are outlets 104. Delivery lines 116 provide a fluid path from each of outlets 104 to corresponding cup outlets 122. Each of cups 120 has an outlet 122 disposed to an upper body portion of the cup. Delivery lines 116 couple outlets 104 to the corresponding outlets of each of cups 122. Slide body 114 is disposed within a slot defined within plate 106. Slide body 114 may move in a plane parallel with the surface of the substrate away from and towards an edge of substrate 108. This movement enables initial placement of the substrate between the corresponding alignment pins 110a, 110b, and 124, as illustrated in FIGS. 1 and 3. In one embodiment, slide body 114 travels in a slot in the plate. It should be appreciated that alternative configurations may be used which accomplish similar sliding capability for slide body 114. Guide pins 110*a*-1 through 110*d*-1 extend from a back surface of plate 106. As will be discussed further below guide pins 110*a*-1 through 110*d*-1 provide support for cleaning assembly 100 when cleaning assembly 100 is disposed within a tank. In one embodiment alignment pins 110*a* and 110*b* are attached to guide pins 110*a*-1 and 110*b*-1. It should be appreciated that a central region of plate 106 has a plurality of openings defined therethrough. The openings within the central region of plate 106 are defined within a plurality of cross members. At the intersection of the cross members cups 120 are supported. In one embodiment, cups 120 are supported in a manner that enables the cups to independently float or move within a distance range orthogonally relative to the surface of plate 106 as described in more detail below. In another embodiment, cups 120 may be supported as detailed in application Ser. No. 13/086,327, which is incorporated herein for all purposes.

FIG. 3 is a simplified schematic diagram illustrating a cross-sectional view of the cleaning assembly in accordance with one embodiment of the invention. Plate 106 includes a plurality of holes or openings defined within a central region of the plate. An upper body of cups 120 extends through cross members defined within the central region. Openings at the intersection of the cross members enable an upper body portion of cups 120 to extend therethrough. In one embodiment, a diameter of a length of the upper body of the cups 120 that proceeds through the openings of the intersection of the cross members is slightly less than the diameter of the opening. Thus, the length of this diameter determines the amount of travel for the cups.

Delivery lines 116 of FIG. 3 provide a fluid pathway between the outlets of the vacuum manifold and outlet 122 for the upper body portion of each of cups 120. Slide body 114 is illustrated having alignment pin 124 attached thereto. Substrate 108 is supported through cups 120 and alignment pins 110 *a*, 110*b*, and 124. A channel defined within cups 120 provides a pathway from outlets 122 at the top of the upper body portion of the cups to a sealing portion of the cups. Thus, a vacuum applied to the sealing portion of cups 120 results in a bottom peripheral surface of the cups sealing against the surface of substrate 108. It should be noted that the ceiling surface on the bottom of cups 120 may be an O-ring disposed within an annular channel along a periphery of the bottom surface of the cup. It should be appreciated that cups 120 isolate regions on the surface of substrate 108, as discussed in more detail with reference to FIGS. 11A and 11B, as well as support substrate 108. The support of substrate 108 is enhanced through alignment pins 110*a*, 110*b*, and 124.

Figure 4A:
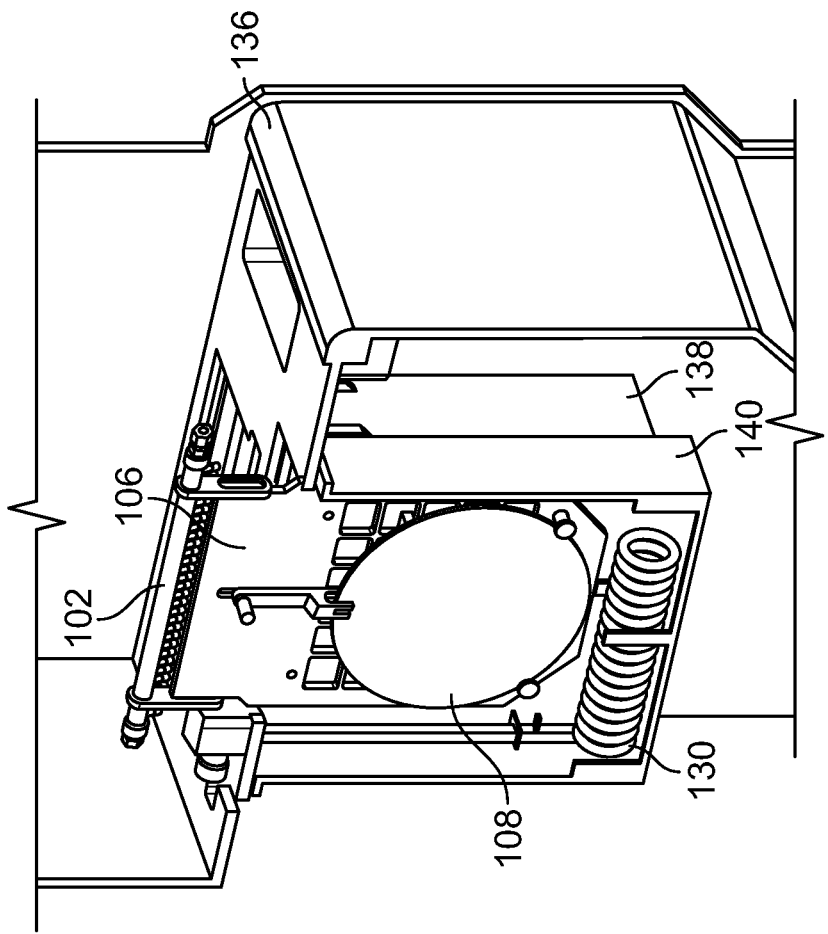
FIGS. 4A and 4B are simplified schematic diagrams illustrating the cleaning assembly within a cleaning tank in accordance with one embodiment of the invention.
Figure 4B:
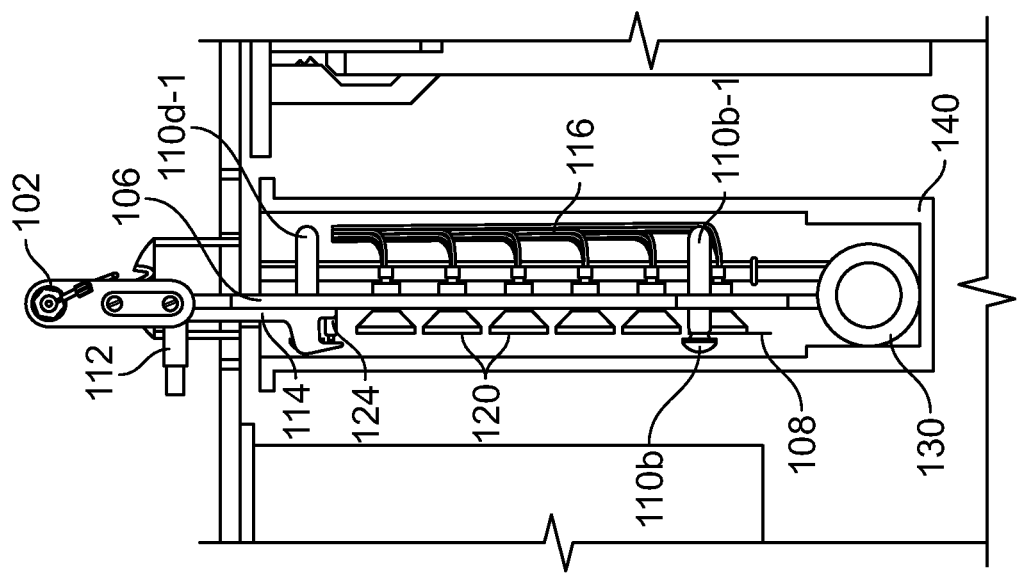

FIGS. 4A and 4B are simplified schematic diagrams illustrating the cleaning assembly within a cleaning tank in accordance with one embodiment of the invention. FIG. 4A is a simplified schematic diagram illustrating a perspective view of the cleaning assembly within cleaning tank 140 of tank 136 with the front of the cleaning tank removed for illustrative purposes. Substrate 108 is supported on the cleaning assembly. Manifold 102 provides vacuum to the cups disposed behind substrate 108 in order to isolate the regions on the surface of the substrate, as well as support the substrate. Plate 106 provides the structural support for coupling manifold 102 and substrate 108, as well as the structural support for the floating cups 120. Disposed within tank 140 is heating element 130. In one embodiment the cleaning of the unprocessed regions outside of cups 120 is enhanced by heating the cleaning solution within tank 140 through heating element 130. In FIG. 4B, a cross-sectional side view of tank 140 is provided. Heating coil 130 is disposed within a bottom region of tank 140. Manifold 102 is affixed to a side edge of plate 106. Substrate 108 is supported through cups 120 which are in fluid communication with a vacuum source through manifold 102. Substrate 108 is also supported through alignment pins 110*a*, 110*b* and 124. In one embodiment, the alignment pins have a notch to receive an edge of substrate 108. Slide body 114 enables release of substrate 108 once the slide body is moved away from an edge of the substrate and the vacuum is terminated so that cups 120 are not suctioned against the surface of the substrate. Guide pins 110*a*-1, 110*b*-1, 110*c*-1 and 110*d*-1 provide a guide so that plate 106 remains substantially vertical within tank 140. In addition, guide pins 110*a* and 110*b*, as well as slide body 114, further provide a buffer so that substrate 108 does not come in contact with any of the inside surfaces of tank 140.

Figure 5A:
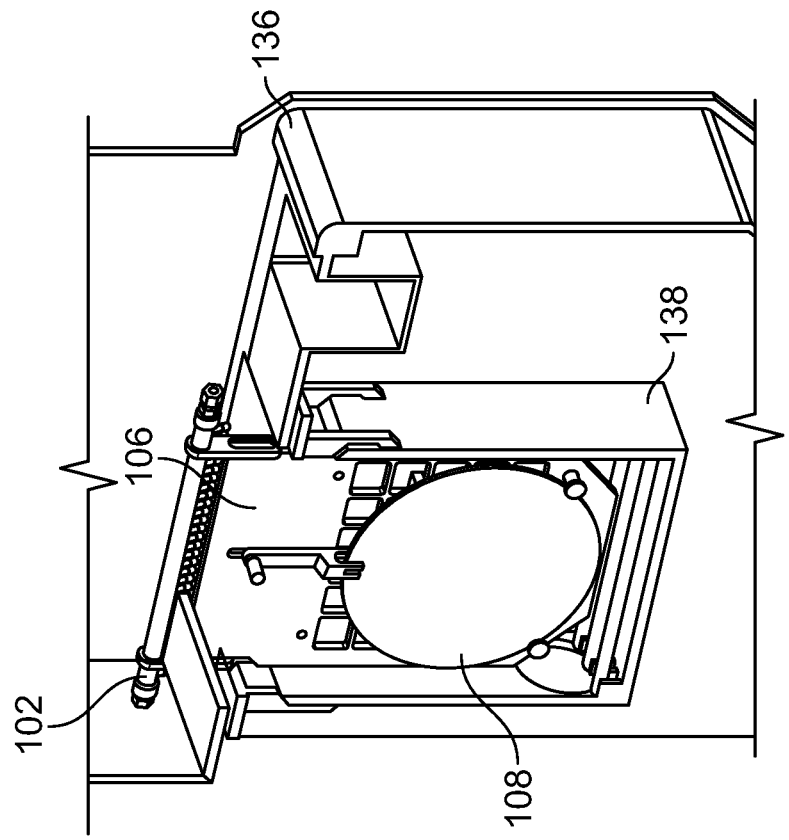
FIGS. 5A and 5B are simplified schematic diagrams illustrating the cleaning assembly within a rinse tank in accordance with one embodiment of the invention.
Figure 5B:
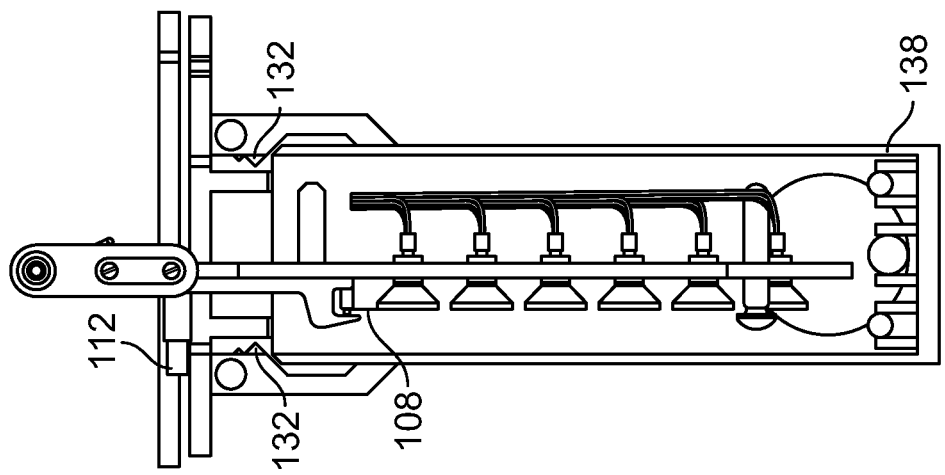

FIGS. 5A and 5B are simplified schematic diagrams illustrating the cleaning assembly within a rinse tank in accordance with one embodiment of the invention. FIG. 5A is a simplified schematic diagram illustrating a perspective view of the cleaning assembly within the rinse tank 138 of tank 136 with a front of the rinse tank removed for illustrative purposes. The cleaning assembly supporting substrate 108 is disposed within rinse tank 138. Vacuum manifold 102 is affixed to side edges of plate 106. FIG. 5B is a cross-sectional side view of tank 138. Tank 138 includes spray nozzles 132 in communication with a fluid source to provide a rinse utilized for rinsing surfaces of substrate 108 after a cleaning operation.

Figure 6:
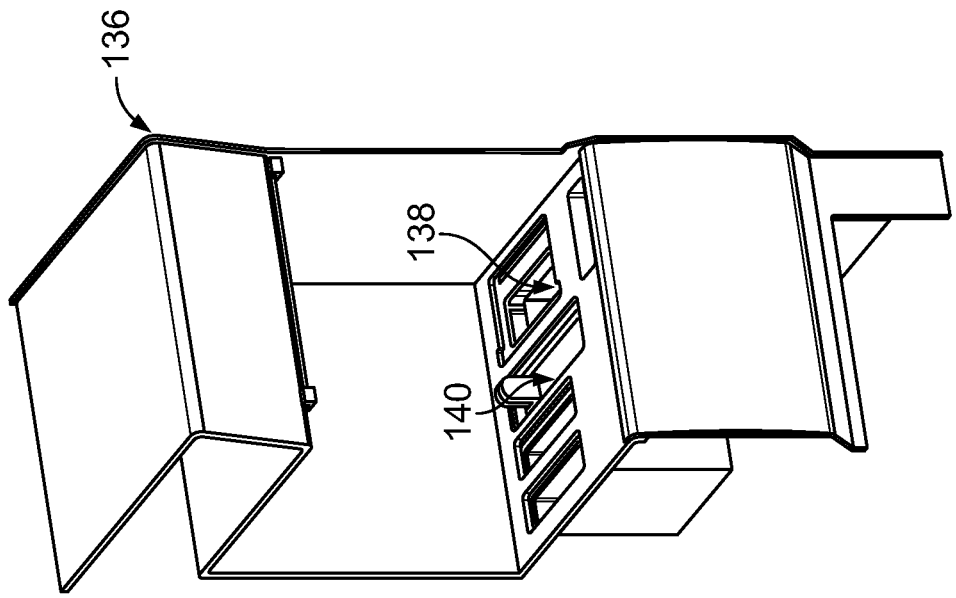
FIG. 6 is a simplified schematic diagram illustrating the housing for the cleaning and rinsing tanks of FIGS. 4A through 5B in accordance with one embodiment of the invention.

FIG. 6 is a simplified schematic diagram illustrating the housing for the cleaning and rinsing tanks of FIGS. 4A through 5B in accordance with one embodiment of the invention. Tank 136 includes an opening within a side surface enabling access to the top openings for tanks 138 and 140. The material of composition for tank 136 is any material compatible with the cleaning operation and chemically inert with the processing. It should be appreciated that the embodiments of FIGS. 1-6 provide for a vertical orientation of the cleaning assembly and the substrate during the cleaning. Described in more detail below are embodiments for the horizontal orientation of the cleaning assembly and the substrate during the cleaning operation.

Figure 7A:
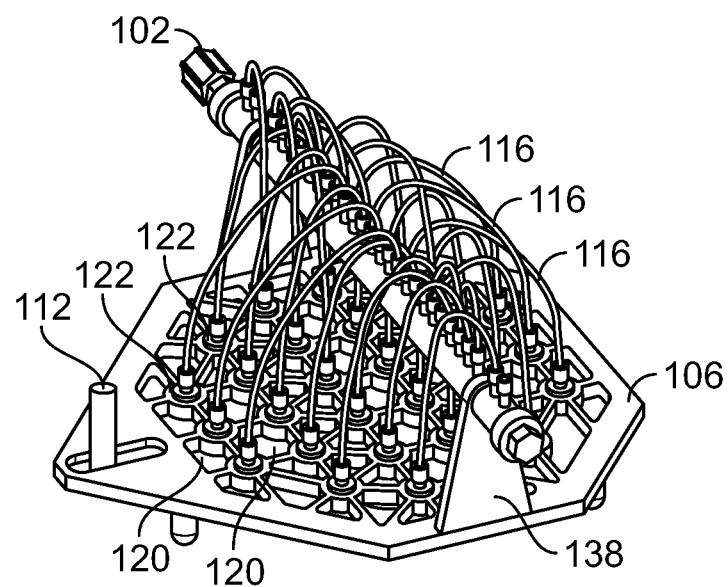
FIG. 7A is a simplified schematic diagram of a top perspective view of a cleaning assembly configured to support a substrate in a horizontal orientation in accordance with one embodiment of the invention.
Figure 7B:
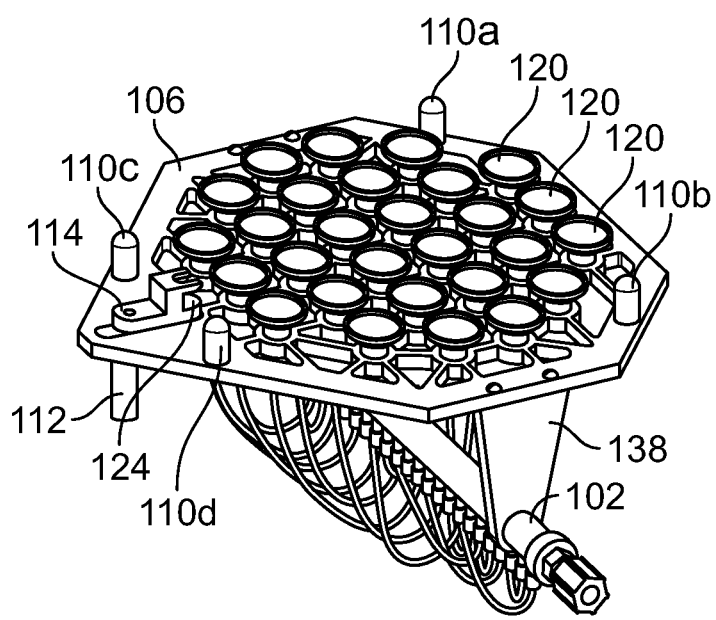
FIG. 7B is a simplified schematic diagram illustrating a bottom perspective view of the cleaning assembly having a horizontal configuration in accordance with one embodiment of the invention.

FIG. 7A is a simplified schematic diagram of a top perspective view of a cleaning assembly configured to support a substrate in a horizontal orientation in accordance with one embodiment of the invention. Manifold 102 is affixed to extensions 138 that are affixed to a top surface of plate 106. Delivery lines 116 provide a fluid pathway from the outlets of the manifold 102 to outlets of cups 122. It should be appreciated that features similar between the horizontal cleaning assembly configuration of FIGS. 7A and 7B and the vertical cleaning assembly configuration of FIGS. 1 through 6 are not repeated here for the sake of clarity. For example, cups 120 are floatably mounted to plate 106 as described above. FIG. 7B is a simplified schematic diagram illustrating a bottom perspective view of the cleaning assembly having a horizontal configuration in accordance with one embodiment of the invention. Vacuum manifold 102 is supported by extension 138, which is affixed to a surface of plate 106. Alignment pins 110*a*, 110*b*, and 124 are provided for support of a substrate. Guide pins 110*a*, 110*b*, 110*c*, and 110*d*, prevent the substrate surface from contacting a surface of a cleaning tank housing the cleaning assembly. Slide body 114 enables movement of alignment pin 124 in order to receive and release a substrate from support between the alignment guides. A bottom surface of cups 120 isolate corresponding regions on a substrate supported by the cleaning assembly. As described above, vacuum may be used in one embodiment to seal the bottom surface of cups 120 against a surface of the substrate. The bottom surface of the cups is configured so that the outer periphery of the bottom surface contacts the surface of the substrate. As mentioned above, an o-ring disposed within an annular channel along the periphery of the bottom surface.

Figure 8:
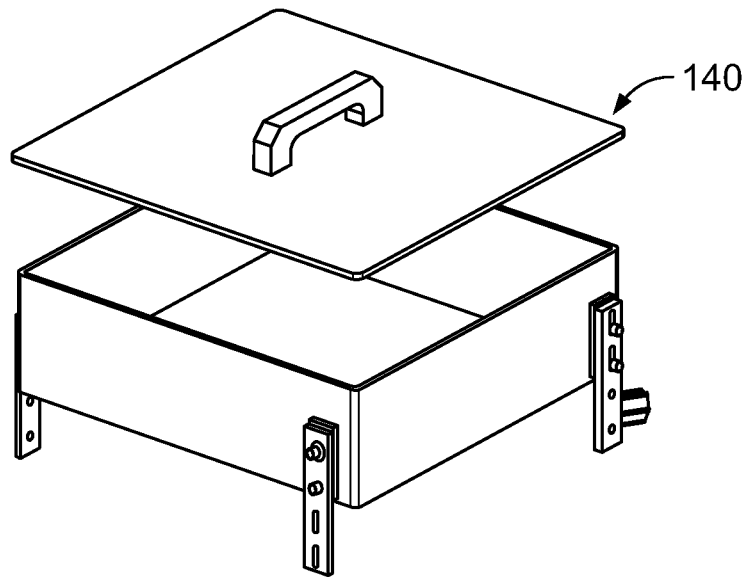
FIG. 8 is a simplified schematic diagram illustrating a tank housing a cleaning assembly and a horizontal configuration in accordance with one embodiment of the invention.
Figure 9:
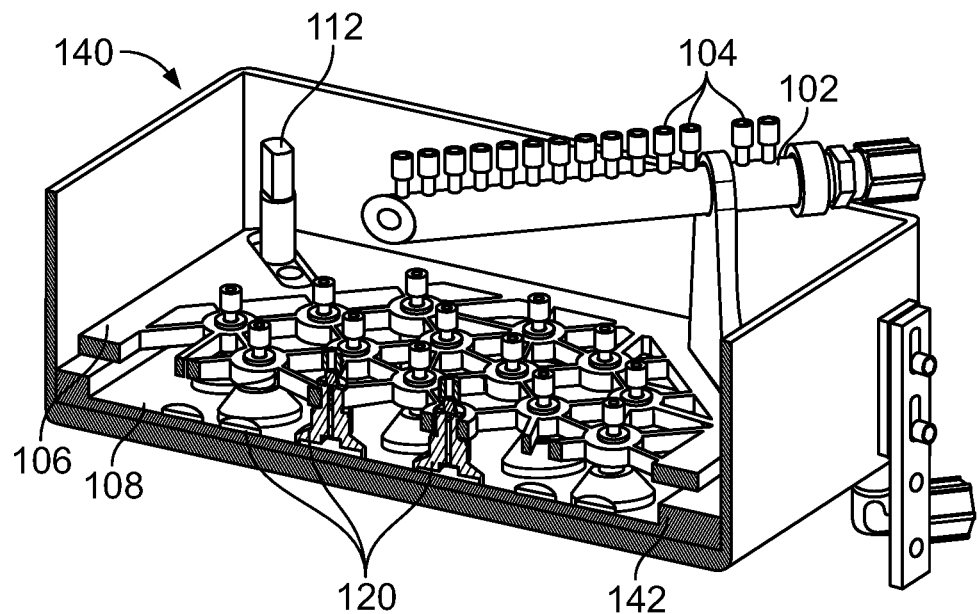
FIG. 9 is a simplified schematic diagram illustrating a cross-sectional view of a holding tank for a horizontal configuration in accordance with one embodiment of the invention.

FIG. 8 is a simplified schematic diagram illustrating a tank housing a cleaning assembly and a horizontal configuration in accordance with one embodiment of the invention. Tank 140 includes a lid disposed over a chamber. Cleaning solution is contained within the chamber and the cleaning assembly is disposed within tank 140. FIG. 9 is a simplified schematic diagram illustrating a cross-sectional view of a tank having a substrate in a horizontal configuration submerged in a cleaning solution in accordance with one embodiment of the invention. Vacuum manifold 102 having a plurality of outlets extending therefrom is affixed to plate 106 through a corresponding extension. Plate 106 supports a plurality of cups 120 that support substrate 108 through suction applied by a vacuum source through manifold 102. Cleaning solution 142 is contained within holding tank 140 and substrate 108 is submerged in the cleaning solution. In one embodiment, less cleaning solution is needed for the horizontal cleaning configuration as compared to the vertical cleaning configuration.

Figure 10:
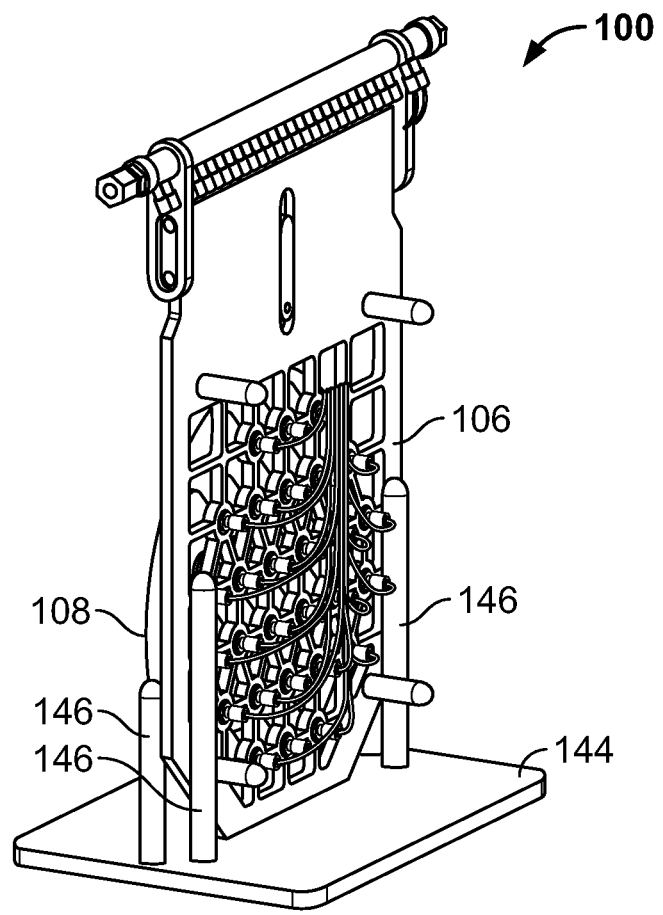
FIG. 10 is a simplified schematic diagram illustrating a stand capable of supporting the cleaning assembly in accordance with one embodiment of the invention.

FIG. 10 is a simplified schematic diagram illustrating a stand capable of supporting the cleaning assembly in accordance with one embodiment of the invention. Plate 106 of cleaning assembly 100 is disposed between legs 146 extending from base 144 of the storage stand. The height of legs 146 is different depending on the surface of plate 106 being supported. That is, the substrate support side of the stand has smaller legs 146 extending from base 144 in order not to damage substrate 108.

FIG. 11A is a simplified schematic diagram of a substrate that may be supported and processed with the cleaning assembly described herein in accordance with one embodiment of the invention. Substrate 108 includes a plurality of regions 200 that are produced through the site isolated combinatorial processing referenced above. It should be appreciated that each region, or at least one region, may be processed differently through combinatorial processing tools of the assignee. The area outside of each region 200 is the region processed by the cleaning assembly described herein. That is, the cups of the cleaning assembly isolate the majority of the surface area of regions 200 so that the area outside of the regions can be cleaned in order to enable substrate 108 to be introduced to a semiconductor processing tool for any semiconductor processing operation.

Figure 11D:
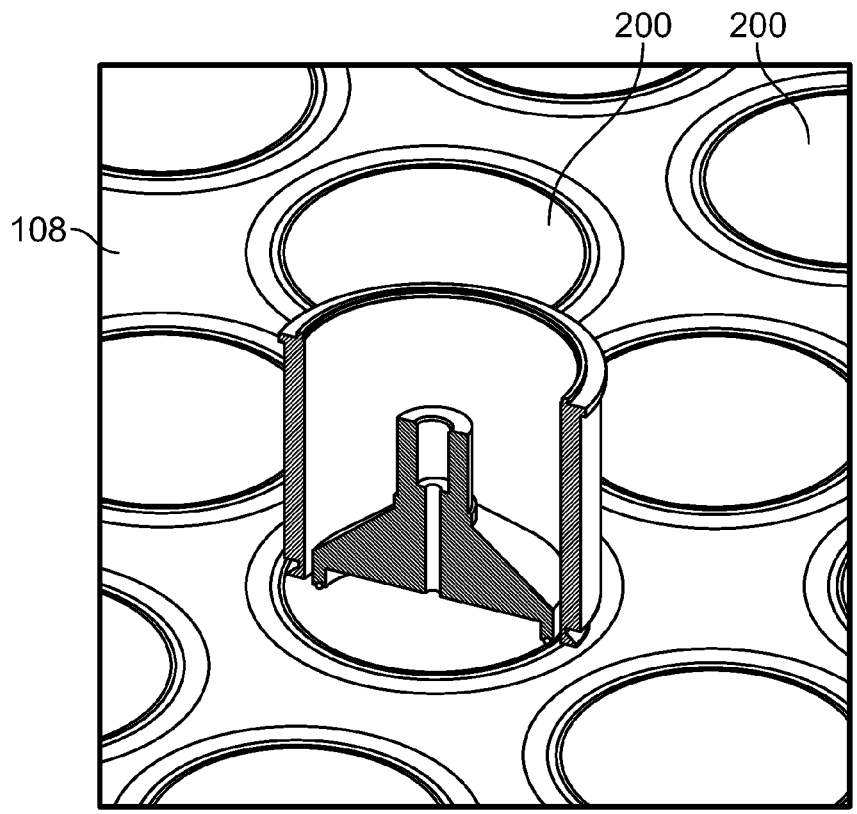

FIG. 11B is a simplified schematic diagram illustrating details on the isolation of the regions for the cleaning of the area outside of the regions in accordance with one embodiment of the invention. Region 200 of substrate 108 is illustrated having useable processing area 152 surrounded by masking sleeve region 154, double processed region 158 and reactor sleeve region 156. FIG. 11C is a simplified schematic diagram of a cross sectional view of the site isolated reactor sleeve and the cup that results in the configuration of region 200 of FIG. 11B in accordance with one embodiment of the invention. Sealing portion of cup 120 is illustrated inside of the internal area of reactor sleeve 150. Lip 204 of reactor sleeve 150 corresponds to the annular ring for reactor sleeve region 156. O-ring 202 of cup 120 corresponds to the annular ring of masking sleeve region 154. As the outer diameter of o-ring-202 of cup 120 is slightly smaller than the inner diameter of lip 204 of reactor sleeve 150, an annular ring illustrated as double processed region 158 of FIG. 11B results. It should be appreciated that double processed region 158 is exposed to the combinatorial processing and the cleaning operation described herein. FIG. 11D is a simplified schematic diagram illustrating a cross sectional view of the site isolated reactor sleeve and cup disposed over a corresponding region of the substrate in accordance with one embodiment of the invention.

The above described embodiments provide for an apparatus that can seal the regions that have been combinatorially processed so that external regions may be cleaned without affecting the combinatorially processed region. In one embodiment, the cups are sealed against the corresponding regions of the substrate and the external area to the regions is cleaned. Vacuum may be applied to a portion of the cups to lift the substrate to a cleaning tank. The remainder of the cups can be sealed against the corresponding regions through vacuum prior to submerging the substrate. In one embodiment, vacuum can be utilized to lift the substrate and prior to submerging the substrate the regions may be isolated through the use of a positive pressure introduces through each cup to isolate the corresponding regions.

FIG. 12 is a simplified schematic diagram illustrating an overview of the High-Productivity Combinatorial (HPC™) screening process for use in evaluating materials, unit processes, and process sequences for the manufacturing of semiconductor devices in accordance with one embodiment of the invention. As illustrated in FIG. 12, primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

In one embodiment, the primary and secondary testing may occur on a coupon, while the tertiary testing is performed on a production size wafer. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels. With regard to the cleaning assembly described herein, the primary testing may involve experimentation on a coupon or substrate with multiple with multiple regions on the substrate being processed differently. The substrate may be cleaned through the ex-situ cleaning assembly described herein so that the most promising candidates can be determined. Thereafter, secondary screening may take the most promising candidates from the primary screening and perform further experiments. After the further experiment, the substrate is again cleaned through the ex-situ cleaning assembly described herein so that the most promising candidates can be further narrowed. This final set of most promising can be tested through tertiary combinatorial testing techniques cleaned through the ex-situ cleaning assembly described herein in order to evaluate the outcome of the tertiary testing.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

In the various screening levels, the process tools may be the same or may be different. For example, in dry processing the primary screening tool may be a combinatorial sputtering tool available described, for example, in U.S. Pat. No. 5,985,356. This tool is efficient at preparing multi-material samples in regions for simple materials properties analysis. For secondary and/or tertiary screening technique, a modified cluster tool may be retrofitted with a combinatorial chamber. As another example, in wet processing, the primary and secondary screening can be implemented in a combinatorial tool. The main differences here are not the capabilities of the tools, but the substrates used, the process variations or structures created and the testing done. For the tertiary tool, a wet reactor with combinatorial and non-combinatorial chambers described in U.S. application Ser. No. 11/647,881 filed Dec. 29, 2006, could be used for integrated and more sophisticated processing and analysis.

In the development or screening cycle, typically there are many materials synthesized or processed involving large permutations of a plurality of materials, a plurality of processes, a plurality of processing conditions, a plurality of material application sequences, a plurality of process integration sequences, and combinations thereof. Testing of these many materials may use a simple test, such as adhesion or resistivity and may involve a blanket wafer (or coupon) or one with basic test structures to enable testing for one or more desired properties of each material or unit process. Once the successful materials or unit processes have been selected, combinatorial techniques are applied to analyze these materials or processes within a larger picture. That is, the combinatorial techniques determine whether the selected materials or unit processes meet more stringent requirements during second stage testing. The processing and testing during the second stage may be more complex, e.g., using a patterned wafer or coupon, with more test structures, larger regions, more variations, more sophisticated testing, etc. For example, the structure defined by the material and unit process sequence can be tested for properties related or derived from the structure to be integrated into the commercial product.

This iterative process may continue with larger and more complex test circuits being used for testing different parameters. This approach serves to increase the productivity of the combinatorial screening process by maximizing the effective use of the substrate real estate, and optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequence, etc. are substantially known and/or have been refined via prior stages of screening.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., a die.

The above examples are provided for illustrative purposes and not meant to be limiting. The embodiments described herein may be applied to any process sequence to optimize the process sequence, as well as the materials, processes, and processing conditions utilized in the manufacture of a semiconductor device where there exist multiple options for the materials, processes, processing conditions, and process sequences.

The present invention provides greatly improved methods and apparatus for the differential processing of regions on a single substrate. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stared in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A cleaning assembly, comprising:
   a plate having a front surface and a back surface;
   a manifold affixed to an edge of the plate, the manifold having a plurality of outlets extending therefrom, wherein the plate further comprises;
   a plurality of cups extending through the plate, the plurality of cups having an upper body with an outlet extending from the back surface and the plurality of cups having a sealing portion extending from the front surface, each outlet of the upper body coupled to one of the corresponding plurality of outlets of the manifold;
   a plurality of alignment pins extending from the front surface, the plurality of alignment pins configured to support an edge of a substrate over the sealing portion of the plurality of cups, wherein one of the plurality of alignment pins is slidably mounted to the plate; and
   a plurality of guide pins each extending a same distance from the back surface.

2. The cleaning assembly of claim 1 wherein each of the plurality of cups has a channel extending through the upper body, the channel coupled to the outlet of the upper body.

3. The cleaning assembly of claim 2, wherein the manifold is coupled to a vacuum source.

4. The cleaning assembly of claim 1, wherein the cleaning assembly comprises:
   a tank having a top opening through which the plate is disposed therethrough, wherein the plate and the substrate are vertically oriented.

5. The cleaning assembly of claim 1, wherein at least two of the plurality of guide pins and the plurality of alignment pins are coupled to each other through the plate.

6. The cleaning assembly of claim 1, wherein a central region of the plate has a plurality of openings defined within cross members, and wherein the upper body for the plurality of cups is disposed within the cross members.

7. A cleaning assembly, comprising;
   a plate having a top surface and a bottom surface;
   a manifold extending over and affixed to the top surface of the plate, the manifold having a plurality of outlets extending therefrom, wherein the plate further comprises;
   a plurality of cups extending through the plate, the plurality of cups having an upper body with an outlet extending from the top surface and the plurality of cups having a sealing portion extending from the bottom surface, each outlet of the upper body coupled to one of the corresponding plurality of outlets of the manifold, the plurality of cups each having a channel extending from the outlet extending from the top surface to the sealing portion, wherein the upper body of each of the plurality of cups are independently flexibly supported by the plate; and
   a plurality of alignment pins extending from the bottom surface, the plurality of alignment pins configured to support an edge of a substrate over the sealing portion of the plurality of cups, wherein one of the plurality of alignment pins is slidably mounted to the plate.

8. The cleaning assembly of claim 7, wherein the manifold is in fluid communication with a vacuum source.

9. The cleaning assembly of claim 7, wherein the plate and the plurality of cups are composed of plastic material.

10. The cleaning assembly of claim 7, wherein the cleaning assembly comprises:
    a tank having a top opening through which the plate is disposed therethrough, the tank having a cleaning solution, wherein the plate and the substrate are horizontally oriented.

11. The cleaning assembly of claim 7, wherein the sealing portion includes an o-ring that seals against a surface of the substrate.

12. The cleaning assembly of claim 7, wherein the cups are held against a surface of the substrate through vacuum suction.

13. The cleaning assembly of claim 7, wherein a central region of the plate has a plurality of openings defined within cross members, and wherein the upper body for the plurality of cups is disposed within the cross members.

14. The cleaning assembly of claim 10, wherein a surface of the substrate has a plurality of regions defined thereon, the plurality of regions being processed differently, and wherein the sealing portion of the plurality of cups isolates a majority of a surface area of each of the plurality of regions from the cleaning solution.

\* \* \* \* \*